(12) United States Patent
Wei et al.

(10) Patent No.: US 10,388,880 B2
(45) Date of Patent: Aug. 20, 2019

(54) APPARATUS AND METHOD FOR FORMING ORGANIC LIGHT EMITTING DIODE

(71) Applicants: Tsinghua University, Beijing (CN); HON HAI PRECISION INDUSTRY CO., LTD., New Taipei (TW)

(72) Inventors: Yang Wei, Beijing (CN); Hao-Ming Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/488,405

(22) Filed: Apr. 14, 2017

(65) Prior Publication Data

US 2017/0352810 A1   Dec. 7, 2017

(30) Foreign Application Priority Data

Jun. 3, 2016 (CN) .......................... 2016 1 0386041

(51) Int. Cl.
| | |
|---|---|
| H01L 51/00 | (2006.01) |
| H01L 51/52 | (2006.01) |
| H01L 51/56 | (2006.01) |
| H01L 51/50 | (2006.01) |

(52) U.S. Cl.
CPC ........ *H01L 51/0048* (2013.01); *H01L 51/001* (2013.01); *H01L 51/0021* (2013.01); *H01L 51/0049* (2013.01); *H01L 51/5203* (2013.01); *H01L 51/5287* (2013.01); *H01L 51/56* (2013.01); *H01L 51/5012* (2013.01)

(58) Field of Classification Search
CPC ............. H01L 2924/0002; H01L 51/56; H01L 2924/00; H01L 51/5206; H01L 51/5012
See application file for complete search history.

(56) References Cited

U.S. PATENT DOCUMENTS

| | | | |
|---|---|---|---|
| 2003/0230238 A1 | 12/2003 | Papadimitrakopoulos | |
| 2010/0122980 A1* | 5/2010 | Wang | ............... H05B 3/145 219/553 |
| 2011/0095237 A1 | 4/2011 | Liu et al. | |
| 2015/0111312 A1* | 4/2015 | Kakiuchi | ............... C23C 14/54 438/7 |
| 2015/0287846 A1* | 10/2015 | Helander | ............... C23C 14/024 257/40 |

FOREIGN PATENT DOCUMENTS

| | | |
|---|---|---|
| JP | 20080287996 A | 11/2008 |
| JP | 20110088813 A | 5/2011 |
| JP | 20130014448 A | 1/2013 |

* cited by examiner

*Primary Examiner* — Tony Tran
(74) *Attorney, Agent, or Firm* — ScienBiziP, P.C.

(57) ABSTRACT

A method for forming an organic light emitting diode is provided. A substrate and an evaporating source are provided. A first electrode is formed on a surface of the substrate. The evaporating source is spaced from the first electrode. The carbon nanotube film structure is heated to gasify an organic light emitting material and form an organic light emitting layer on a surface of the first electrode. A second electrode is formed on a surface of the organic light emitting layer.

11 Claims, 9 Drawing Sheets

US 10,388,880 B2

APPARATUS AND METHOD FOR FORMING ORGANIC LIGHT EMITTING DIODE

CROSS-REFERENCE TO RELATED APPLICATIONS

This application claims priority to Chinese Patent Application No. 201610386041.8, filed on Jun. 3, 2016, the disclosure of which is incorporated herein by reference.

FIELD

The present disclosure relates to a apparatus and a method for forming an organic light emitting diode.

BACKGROUND

An organic light emitting diode (OLED) is widely researched because the organic light emitting diode has many advantages, such as low cost, lightweight, flexible, and simple production process. Conventionally, an organic light emitting layer of organic light emitting diode is formed by vapor deposition method. A large uniform organic light emitting layer is hard to make. In order to form a uniform organic light emitting layer, it is necessary to form a uniform gaseous vapor deposition material around a substrate. It is difficult to control an atom diffusion direction of a gaseous vapor deposition material, and most of the vapor deposition material can not adhere to the surface of the substrate. Thus, a deposition rate of the vapor deposition material is low.

BRIEF DESCRIPTION OF THE DRAWINGS

Implementations of the present technology will now be described, by way of example only, with reference to the attached figures.

DETAILED DESCRIPTION

Figure 1:
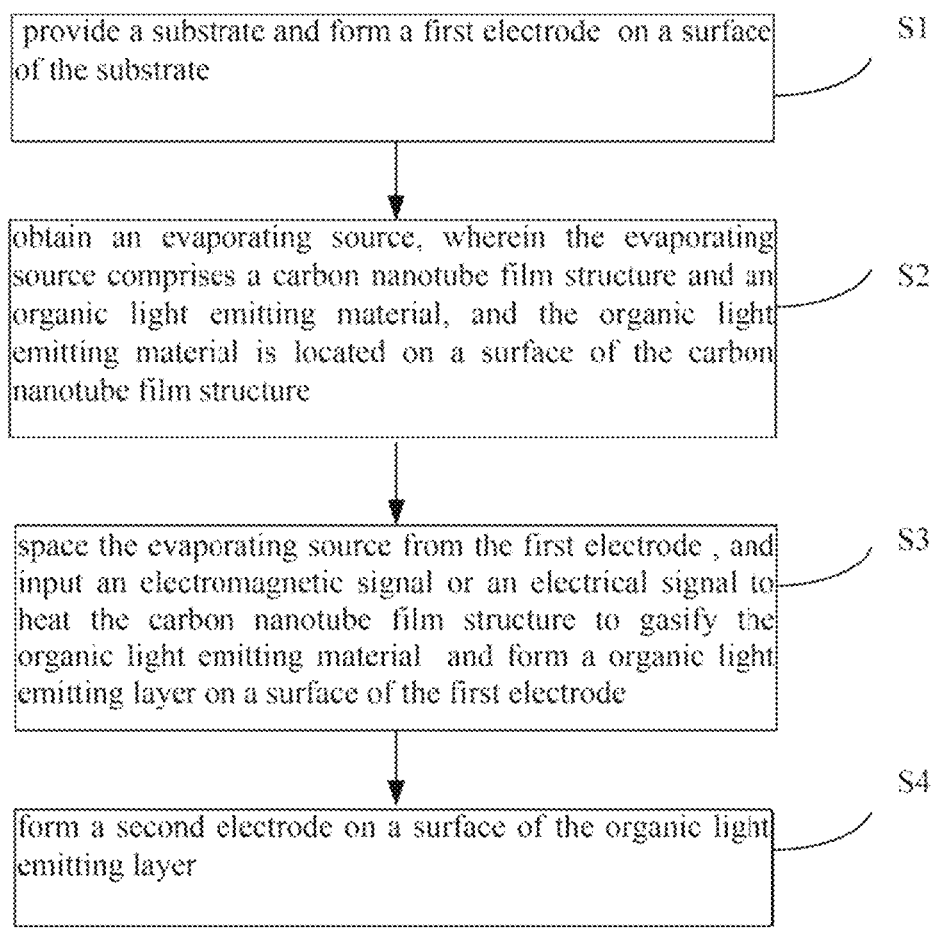
FIG. 1 is a flowchart of one embodiment of a method for forming an organic light emitting diode.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one".

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better.

The term "comprise" or "comprising" when utilized, means "include or including, but not necessarily limited to"; it specifically indicates open-ended inclusion or membership in the so-described combination, group, series, and the like.

Figure 2:
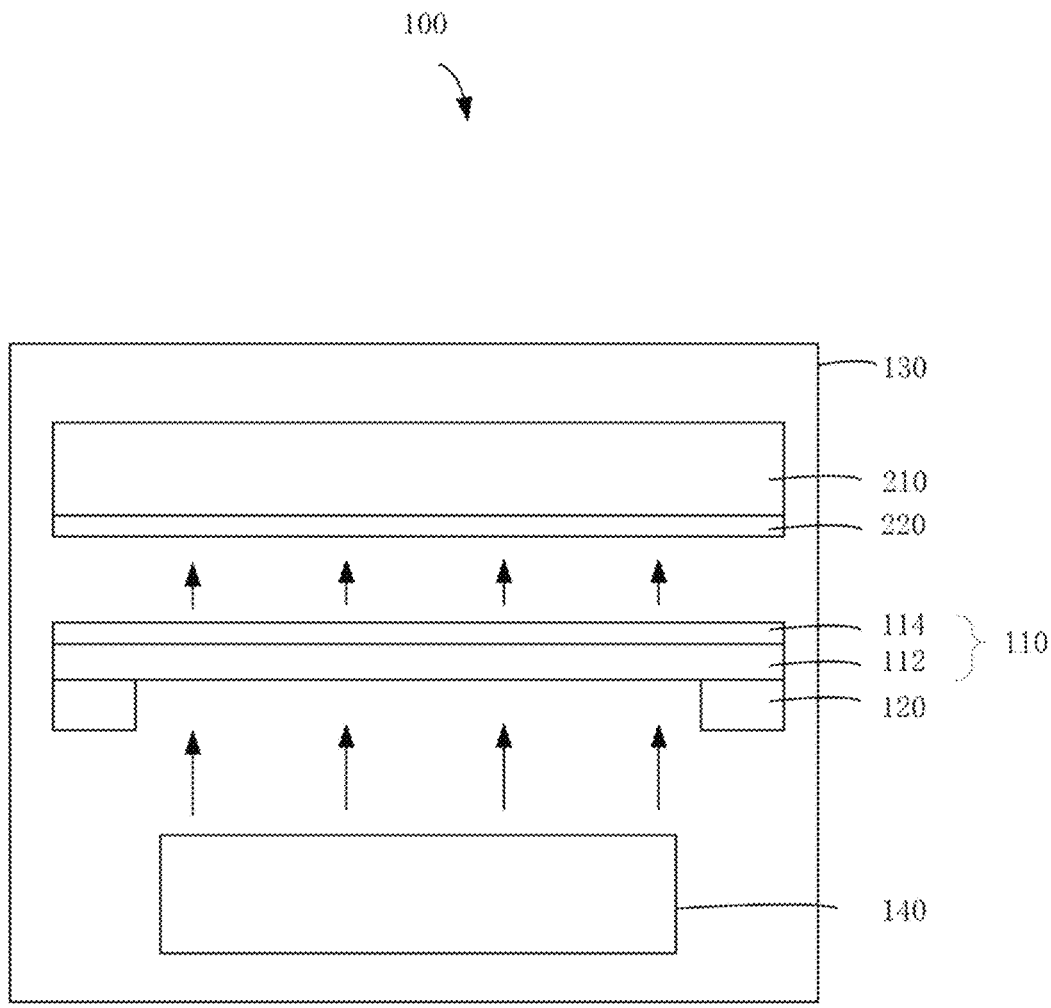
FIG. 2 is a side view of one embodiment of an apparatus for forming the organic light emitting diode.
Figure 3:
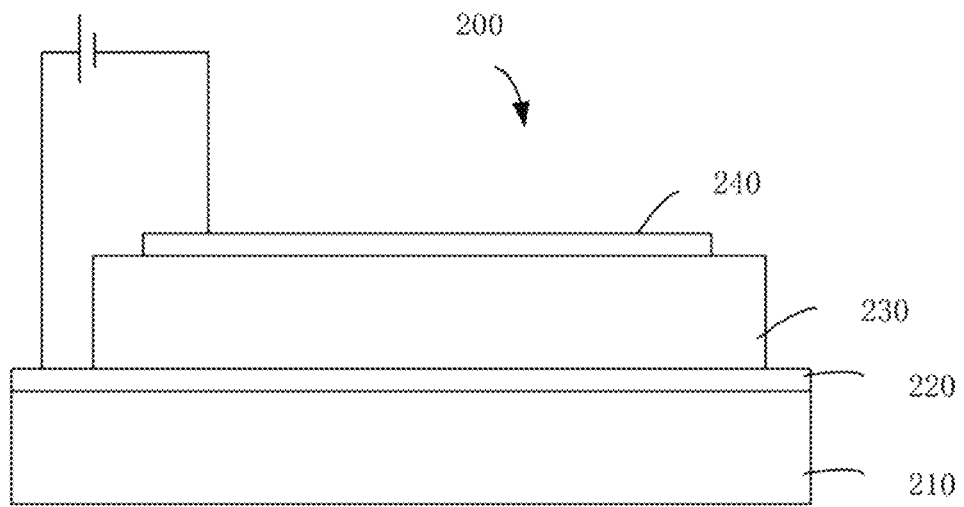
FIG. 3 is a side view of one embodiment of the organic light emitting diode.

Referring to FIG. 1 to FIG. 3, a method of forming an organic light emitting diode 200 according to one embodiment is provided. The method of forming the organic light emitting diode 200 comprises the following steps:

S1: providing a substrate 210 and forming a first electrode 220 on a surface of the substrate 210;

S2: obtaining an evaporating source 110, wherein the evaporating source 110 comprises a carbon nanotube film structure 112 and an organic light emitting material 114, and the organic light emitting material 114 is located on a surface of the carbon nanotube film structure 112;

S3: spacing the evaporating source 110 from the first electrode 220, and inputting an electromagnetic signal or an electrical signal to heat the carbon nanotube film structure 112 to gasify the organic light emitting material 114 and form an organic light emitting layer 230 on a surface of the first electrode 220; and S4: forming a second electrode 240 on a surface of the organic light emitting layer 230.

The substrate 210 is an insulating substrate. The substrate 210 can be a hard substrate or a flexible substrate. The first electrode 220 and the second electrode 240 both are conductive layers. If a light incident surface of the organic light emitting diode 200 is a surface of the substrate 210, the substrate 210 can be a transparent substrate, such as a glass substrate, a quartz substrate, a transparent plastic substrate or a resin substrate. The first electrode 220 can be a transparent conductive layer or a porous network structure, such as an ITO layer, an FTO layer or a carbon nanotube film. The second electrode 240 can be the transparent conductive layer, an opaque conductive layer or the porous network structure, such as a metal thin film, a metal mesh, the ITO layer, the FTO layer or the carbon nanotube film. If the light incident surface of the organic light emitting diode 200 is a surface of the second electrode 240, the substrate 210 may be an opaque substrate, such as a silicon substrate. The second electrode 240 can be the transparent conductive layer or the porous network structure, such as the ITO layer, the FTO layer or the carbon nanotube film. The first electrode 220 can be the transparent conductive layer, the opaque conductive layer or the porous network structure, such as the metal thin film, the metal mesh, the ITO layer, the FTO layer or the carbon nanotube film. The first electrode 220 and the second electrode 240 can be formed by a conventional method, such as a vapor deposition method, a sputtering method or a coating method. In one embodiment, the organic light emitting material 114 is a material of the organic light emitting layer 230. In another embodiment, the organic light emitting material 114 is a precursor for forming the organic light emitting layer 230, and the precursor reacts to form the material of the organic light emitting layer 230 during vapor deposition.

The organic light emitting layer 230 is a high molecular polymer or a small molecule organic compound having high quantum efficiency, good semiconductivity, and thermal stability. A molecular weight of the high molecular polymer is between 10000 and 100000. The high molecular polymer can be a conductive conjugated polymer or a semiconductor conjugated polymer. A molecular weight of the small molecule organic compound is between 500 and 20000. The small molecule organic compound can be an organic dye. The organic dye has characteristics of strong chemical modification, wide selection range, easy purification and high quantum efficiency. The small molecule organic compound can be a red material. The red material can be selected from the group consisting of rhodamine dyes, DCM, DCT, DCJT, DCJTB, DCJTI and TPBD. The small molecule organic compound can be a green material. The green material can be selected from coumarin 6, quinacridone (QA), coronene, naphthalimide. The small molecule organic compound can be a blue material. The blue material can be selected from the group consisting of N-arylbenzimidazoles, and 1,2,4-triazole derivatives (TAZ) and distyrylarylene. A material of the organic light emitting layer 230 and the organic light emitting material 114 is not limited to the above material, as long as a gasification temperature of the organic light emitting material 114 is lower than a gasification temperature of carbon nanotubes and the organic light emitting material 114 does not react with carbon during a vapor deposition process. The gasification temperature of the organic light emitting material 114 is less than or equal to 300□.

The carbon nanotube film structure 112 is a carrying structure for the organic light emitting material 114. The organic light emitting material 114 is located on a surface of the carbon nanotube film structure 112. The carbon nanotube film structure 112 is capable of forming a free-standing structure and can be suspended by supporters. The organic light emitting material 114 is located on a surface of a suspended carbon nanotube film structure 112. In one embodiment, in S2, two supporters 120 are provided. The two supporters 120 are spaced from each other and located on opposite two ends of the carbon nanotube film structure 112. The carbon nanotube film structure 112 is suspended by the two supporters 120. The organic light emitting material 114 is located on a suspended surface of carbon nanotube film structure 112.

The carbon nanotube film structure 112 comprises a single carbon nanotube film or at least two stacked carbon nanotube films. The carbon nanotube film comprises a plurality of nanotubes. The plurality of nanotubes are generally parallel to each other and arranged substantially parallel to a surface of the carbon nanotube film structure 112. The carbon nanotube film structure 112 has a uniform thickness. The carbon nanotube film can be regarded as a macro membrane structure. In the macro membrane structure, an end of one carbon nanotube is joined to another end of an adjacent carbon nanotube arranged substantially along the same direction by Van der Waals attractive force. The carbon nanotube film structure 112 and the carbon nanotube film have a macro area and a microscopic area. The macro area denotes a membrane area of the carbon nanotube film structure 112 or the carbon nanotube film when the carbon nanotube film structure 112 or the carbon nanotube film is regarded as a membrane structure. In terms of a microscopic area, the carbon nanotube film structure 112 or the carbon nanotube film is a network structure having a large number of nanotubes joined end to end. The microscopic area signifies a surface area of the carbon nanotubes actually carrying the photoactive material 114.

In one embodiment, the carbon nanotube film is formed by drawing from a carbon nanotube array. This carbon nanotube array is grown on a growth surface of a substrate by chemical vapor deposition method. The carbon nanotubes in the carbon nanotube array are substantially parallel to each other and perpendicular to the growth surface of the substrate. Adjacent carbon nanotubes make mutual contact and combine by van der Waals forces. By controlling the growth conditions, the carbon nanotube array is substantially free of impurities such as amorphous carbon or residual catalyst metal particles. The carbon nanotube array being substantially free of impurities with carbon nanotubes in close contact with each other, there is a larger van der Waals forces between adjacent carbon nanotubes. When carbon nanotube fragments (CNT fragments) are drawn, adjacent carbon nanotubes are continuously drawn out end to end by van der Waals forces to form a free-standing and uninterrupted macroscopic carbon nanotube film. The carbon nanotube array made of carbon nanotubes drawn end to end is also known as a super-aligned carbon nanotube array. In order to grow the super-aligned carbon nanotube array, the growth substrate material can be a P-type silicon, an N-type silicon, or a silicon oxide substrate.

Figure 4:
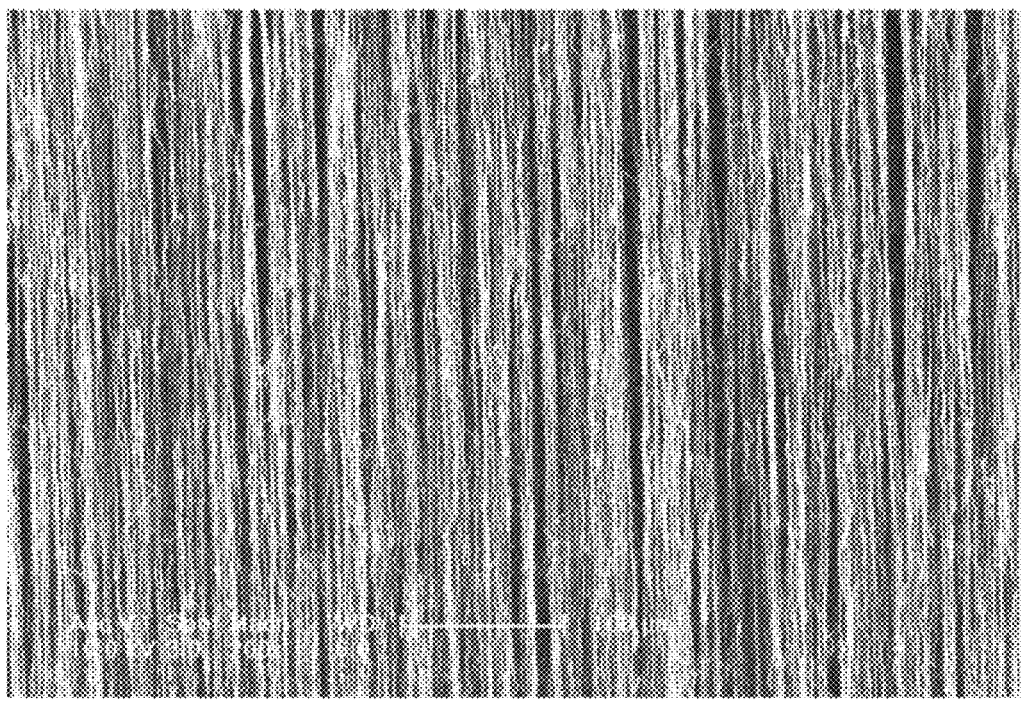
FIG. 4 is a scanning electron microscope (SEM) image of a carbon nanotube film drawn from a carbon nanotube array.

The carbon nanotube film includes a plurality of carbon nanotubes that can be joined end to end and arranged substantially along the same direction. Referring to FIG. 4, a majority of carbon nanotubes in the carbon nanotube film can be oriented along a preferred orientation, meaning that a large number of the carbon nanotubes in the carbon nanotube film are arranged substantially along the same direction. An end of one carbon nanotube is joined to another end of an adjacent carbon nanotube arranged substantially along the same direction by Van der Waals attractive force. A small number of the carbon nanotubes are randomly arranged in the carbon nanotube film and has a small if not negligible effect on the larger number of the carbon nanotubes in the carbon nanotube film arranged substantially along the same direction.

More specifically, the carbon nanotube drawn film includes a plurality of successively oriented carbon nanotube segments joined end-to-end by Van der Waals attractive force therebetween. Each carbon nanotube segment includes a plurality of carbon nanotubes substantially parallel to each other and joined by Van der Waals attractive force therebetween. The carbon nanotube segments can vary in width, thickness, uniformity, and shape. The carbon nanotubes in the carbon nanotube drawn film are also substantially oriented along a preferred orientation.

Microscopically, the carbon nanotubes oriented substantially along the same direction may not be perfectly aligned in a straight line, and some curve portions may exist. It can be understood that some carbon nanotubes located substantially side by side and oriented along the same direction in contact with each other cannot be excluded. The carbon nanotube film includes a plurality of gaps between the adjacent carbon nanotubes so that the carbon nanotube film can have better transparency and higher specific surface area.

The carbon nanotube film is capable of forming a free-standing structure. The term "free-standing structure" can be defined as a structure that does not require a substrate for support. For example, a free standing structure can sustain the weight of itself when it is hoisted by a portion thereof without any damage to its structural integrity. So, if the carbon nanotube drawn film is placed between two separate supporters, a portion of the carbon nanotube drawn film, not in contact with the two supporters, would be suspended between the two supporters and yet maintain film structural integrity. The free-standing structure of the carbon nanotube drawn film is realized by the successive carbon nanotubes joined end to end by Van der Waals attractive force.

The carbon nanotube film has a small and uniform thickness in a range from about 0.5 nm to 10 microns. Since the carbon nanotube film drawn from the carbon nanotube array can form the free-standing structure only by van der Waals forces between the carbon nanotubes, the carbon nanotube film has a large specific surface area. In one embodiment, the specific surface area of the carbon nanotube film measured by the BET method is in a range from about 200 $m^2/g$ to 2600 $m^2/g$. A mass per unit area of the carbon nanotube film is in a range from about 0.01 $g/m^2$ to about 0.1 $g/m^2$ (area here refers to the macro area of the carbon nanotube film). In another embodiment, the mass per unit area of the carbon nanotube film is about 0.05 $g/m^2$. Since the carbon nanotube film has a minimal thickness and the heat capacity of the carbon nanotube is itself small, the carbon nanotube film has small heat capacity per unit area. In one embodiment, the heat capacity per unit area of the carbon nanotube film is less than $2\times10^{-4}$ $J/cm^2\cdot K$.

Figure 5:
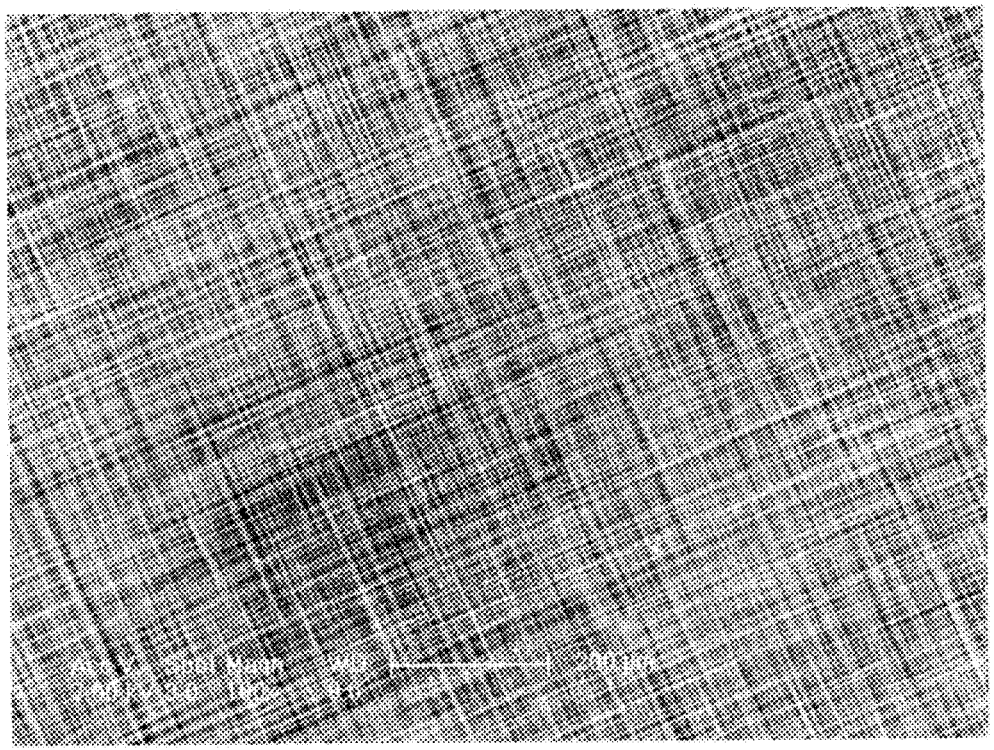
FIG. 5 is a SEM image of a carbon nanotube film structure.

The carbon nanotube film structure 112 may include at least two stacked carbon nanotube films. In one embodiment, a number of layers of the stacked carbon nanotube film is 50 layers or less. In another embodiment, the number of layers of the stacked carbon nanotube film is 10 layers or less. Additionally, an angle can exist between the orientation of carbon nanotubes in adjacent carbon nanotube films. Adjacent carbon nanotube films can be combined by only Van der Waals attractive forces therebetween without the need of an adhesive. An angle between the aligned directions of the carbon nanotubes in two adjacent carbon nanotube films can range from about 0 degrees to about 90 degrees. In one embodiment, referring to FIG. 5, the carbon nanotube film structure 112 includes at least two stacked carbon nanotube films, and the angle between the aligned directions of the carbon nanotubes in the two adjacent carbon nanotube films is 90 degrees.

In S2, the organic light emitting material 114 is located on the surface of the carbon nanotube film structure 112 by a plurality of methods, such as a solution method, a vapor deposition method, a plating method or a chemical plating method. The deposition method may be chemical vapor deposition (CVD) method or physical vapor deposition (PVD) method.

A solution method for depositing the organic light emitting material 114 on the surface of the carbon nanotube film structure 112 comprises the steps of: (21) dissolving or uniformly dispersing the organic light emitting material 114 in a solvent to form a mixture; (22) uniformly coating the mixture to the carbon nanotube film structure 112 by spray coating method, spin coating method, or dip coating method; (23) evaporating and drying the solvent to make the organic light emitting material 114 uniformly attach on the surface of the carbon nanotube film structure 112. In the (S21), the mixture can be a solution or a dispersion.

When the organic light emitting material 114 comprises a plurality of materials, the plurality of materials can be dissolved in a liquid phase solvent and mixed with a required ratio in advance, so that the plurality of materials can be disposed on different locations of the carbon nanotube film structure 112 by the required ratio.

The step (22) and the step (23) can be repeated a plurality of times so that the organic light emitting material 114 can have a required amount on the surface of the carbon nanotube film structure 112.

The organic light emitting material 114 is adhered on and coats the surface of the carbon nanotube film structure 112. Macroscopically, the organic light emitting material 114 can be seen as a layer formed on at least one surface of the carbon nanotube film structure 112. In one embodiment, the organic light emitting material 114 is coated on two surfaces of the carbon nanotube film structure 112. The organic light emitting material 114 and the carbon nanotube film structure 112 form a composite membrane. In one embodiment, a thickness of the composite membrane is less 100 microns or less. In another embodiment, the thickness of the composite membrane is 5 microns or less. An amount of the organic light emitting material 114 carried per unit area of the carbon nanotube film structure 112 is small. Thus, in microscopic terms, a morphology of the organic light emitting material 114 may be nanoscale particles or layers with nanoscale thickness, being attached to a single carbon nanotube surface or the surfaces of a few carbon nanotubes. In one embodiment, the morphology of the organic light emitting material 114 is particles. A diameter of the particles is in a range from about 1 nanometer to 500 nanometers. In another embodiment, the morphology of the organic light emitting material 114 is a layer. A thickness of the organic light emitting material 114 is in a range from about 1 nanometer to 500 nanometers. The organic light emitting material 114 can completely cover and coat a single carbon nanotube for all or part of its length. The morphology of the organic light emitting material 114 coated on the surface of the carbon nanotube film structure 112 is associated with the amount of the organic light emitting material 114, species of the organic light emitting material 114, a wetting performance of the carbon nanotubes, and other properties. For example, the organic light emitting material 114 is more likely to be particle when the organic light emitting material 114 is not soaked in the surface of the carbon nanotube. The organic light emitting material 114 is more likely to uniformly coat a single carbon nanotube surface to form a continuous layer when the organic light emitting material 114 is soaked in the surface of carbon nanotubes. In addition, when the organic light emitting material 114 is an organic material having high viscosity, it may form a continuous film on the surface of the carbon nanotube film structure 112. No matter what the morphology of the organic light emitting material 114 may be, the amount of organic light emitting material 114 carried by per unit area of the carbon nanotube film structure 112 is small. Thus, the electromagnetic signal or the electrical signal can instantaneously and completely gasify the organic light emitting material 114. In one embodiment, the organic light emitting material 114 is completely gasified within 1 second. In another embodiment, the organic light emitting material 114 is completely gasified within 10 microseconds. The organic light emitting material 114 is uniformly disposed on the surface of the carbon nanotube film structure 112 so that different locations of the carbon nanotube film structure 112 carry substantially equal amounts of the organic light emitting material 114.

In the S3, the evaporating source 110 is spaced from the first electrode 220 and the substrate 210. The evaporating source 110 faces the first electrode 220. A distance between the first electrode 220 and the carbon nanotube film structure 112 is substantially equal. The carbon nanotube film structure 112 is substantially parallel to a depositing surface. In one embodiment, the depositing surface is a surface of the first electrode 220. The carbon nanotube film structure 112 coated with the organic light emitting material 114 faces and is spaced from the depositing surface, and a distance between the carbon nanotube film structure 112 and the depositing surface is in a range from about 1 micrometer to about 10 millimeters. The area of the depositing surface is equal to or less than the macro area of the carbon nanotube film structure 112. Thus, a gaseous organic light emitting material 114 can reach the depositing surface substantially at the same time.

The S3 can be carried out in an atmosphere or in a vacuum. In one embodiment, the evaporating source 110 and the organic light emitting material 114 are located in a vacuum room 130. The electromagnetic signal or the electrical signal is inputted to the carbon nanotube film structure 112 to gasify the organic light emitting material 114 and form the organic light emitting layer 230 on the first electrode 220.

When the electromagnetic signal or the electrical signal is inputted to heat the carbon nanotube film structure 112, the organic light emitting material 114 is rapidly heated to the evaporation or sublimation temperature. Since per unit area of the carbon nanotube film structure 112 carries a small amount of the organic light emitting material 114, all the organic light emitting material 114 may instantly gasify. The carbon nanotube film structure 112 and the first electrode 220 are parallel to and spaced from each other. In one embodiment, the distance between the first electrode 220 and the carbon nanotube film structure 112 is in a range from about 1 micrometer to about 10 millimeters. Since the distance between the carbon nanotube film structure 112 and the depositing surface is small, a gaseous organic light emitting material 114 evaporated from the carbon nanotube film structure 112 is rapidly attached to the depositing surface to form the organic light emitting layer 230. The area of the depositing surface is equal or less than the macro area of the carbon nanotube film structure 112. The carbon nanotube film structure 112 can completely cover the depositing surface. Thus, the organic light emitting material 114 is evaporated to the depositing surface as a correspondence to the carbon nanotube film structure 112 to form the organic light emitting layer 230. Since the organic light emitting material 114 is uniformly carried by the carbon nanotube film structure 112, the organic light emitting layer 230 is also a uniform structure. When the organic light emitting material 114 comprises the plurality of materials, a proportion of the plurality of materials is same in different locations of the carbon nanotube film structure 112. Thus, the plurality of materials still has same proportion in the gaseous organic light emitting material 114, and a uniform organic light emitting layer 230 can be formed on the depositing surface.

The electromagnetic signal can be inputted to the carbon nanotube film structure 112 by an electromagnetic signal input device 140. The electromagnetic signal input device 140 can be located in the vacuum room 130 or outside the vacuum room 130, as long as an emitted electromagnetic signal can be transmitted to the carbon nanotube film structure 112. An average power density of the electromagnetic signal is in a range from about 100 mW/mm$^2$ to 20 W/mm$^2$. Since the structure of the carbon nanotube film structure 112 has the large specific surface area, the carbon nanotube film structure 112 can quickly exchange heat with surrounding medium, and heat signals generated by the carbon nanotube film structure 112 can quickly heat the organic light emitting material 114. Since the amount of the organic light emitting material 114 located on per unit macro area of the carbon nanotube film structure 112 is small, the organic light emitting material 114 can be completely gasified instantly by the heat signals.

Figure 6:
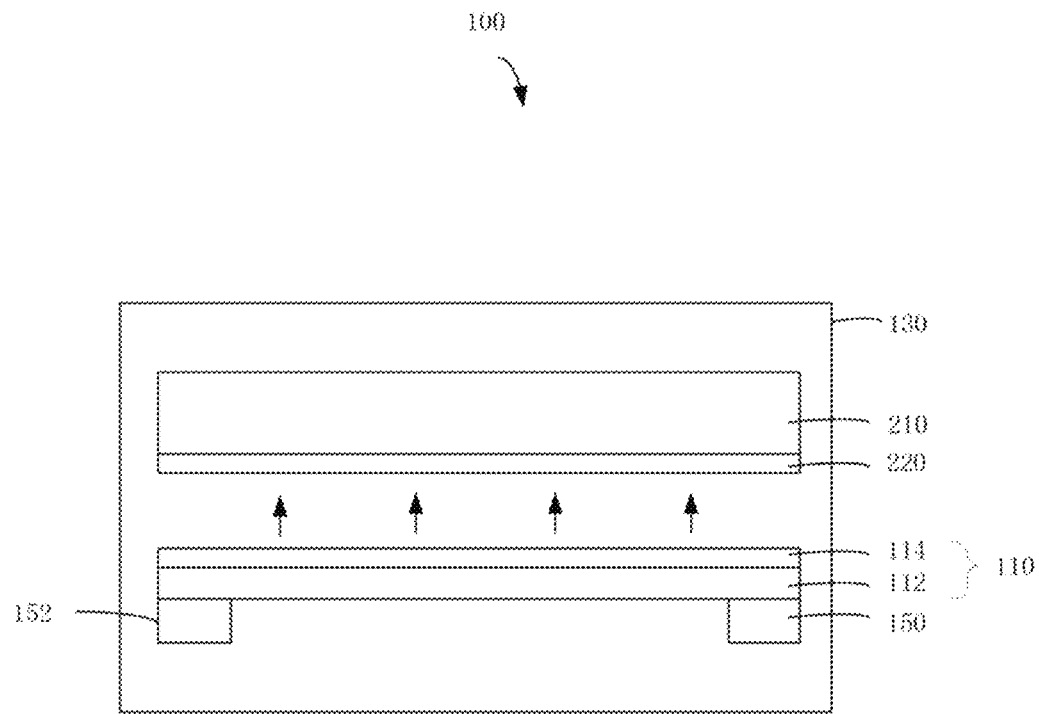
FIG. 6 is a side view of another embodiment of the apparatus for forming the organic light emitting diode.

Referring FIG. 6, the electrical signal can be inputted to the carbon nanotube film structure 112 by a first electrical signal input electrode 150 and a second electrical signal input electrode 152. The first electrical signal input electrode 150 and the second electrical signal input electrode 152 are spaced from each other and electrically connected with the carbon nanotube film structure 112. In one embodiment, the carbon nanotube film structure 112 is suspended by the first electrical signal input electrode 150 and the second electrical signal input electrode 152. The carbon nanotube film structure 112 is a resistive element. The carbon nanotube film structure 112 has the small heat capacity per unit area and has the large specific surface area but the minimal thickness. In one embodiment, the heat capacity per unit area of the carbon nanotube film structure 112 is less than $2\times10^{-4}$ J/cm$^2$·K. In another embodiment, the heat capacity per unit area of the carbon nanotube film structure 112 is less than $1.7\times10^{-6}$ J/cm$^2$·K. The specific surface area of the carbon nanotube film structure 112 is larger than 200 m$^2$/g. The thickness of the carbon nanotube film structure 112 is less than 100 micrometers. The first electrical signal input electrode 150 and the second electrical signal input electrode 152 input the electrical signal to the carbon nanotube film structure 112. Since the carbon nanotube film structure 112 has the small heat capacity per unit area, the carbon nanotube film structure 112 can convert electrical energy to heat quickly, and a temperature of the carbon nanotube film structure 112 can rise rapidly. Since the carbon nanotube film structure 112 has the large specific surface area and is very thin, the carbon nanotube film structure 112 can rapidly transfer heat to the organic light emitting material 114. The organic light emitting material 114 is rapidly heated to the evaporation or sublimation temperature.

The first electrical signal input electrode 150 and the second electrical signal input electrode 152 are electrically connected with the carbon nanotube film structure 112. In one embodiment, the first electrical signal input electrode 150 and the second electrical signal input electrode 152 are directly located on the surface of the carbon nanotube film structure 112. The first electrical signal input electrode 150 and the second electrical signal input electrode 152 can input a current to the carbon nanotube film structure 112. The first electrical signal input electrode 150 and the second electrical signal input electrode 152 are spaced from each other and located at either end of the carbon nanotube film structure 112.

In one embodiment, the plurality of carbon nanotubes in the carbon nanotube film structure 112 extends from the first electrical signal input electrode 150 to the second electrical signal input electrode 152. When the carbon nanotube film structure 112 consists of one carbon nanotube film, or of at least two films stacked along a same direction (i.e., the carbon nanotubes in different carbon nanotube films being arranged in a same direction and parallel to each other), the plurality of carbon nanotubes of the carbon nanotube film structure 112 extend from the first electrical signal input electrode 150 to the second electrical signal input electrode 152. In one embodiment, the first electrical signal input electrode 150 and the second electrical signal input electrode 152 are linear structures and are perpendicular to extended directions of the carbon nanotubes of at least one carbon nanotube film in the carbon nanotube film structure 112. In one embodiment, the first electrical signal input electrode 150 and the second electrical signal input electrode 152 are same as a length of the carbon nanotube film structure 112, the first electrical signal input electrode 150 and the second electrical signal input electrode 152 thus extending from one end of the carbon nanotube film structure 112 to the other end. Thus, each of the first electrical signal input electrode 150 and the second electrical signal input electrode 152 is connected with two ends of the carbon nanotube film structure 112.

The carbon nanotube film structure 112 is the freestanding structure and can be suspended by the first electrical signal input electrode 150 and the second electrical signal input electrode 152. In one embodiment, the first electrical signal input electrode 150 and the second electrical signal input electrode 152 have sufficient strength to support the carbon nanotube film structure 112, and the two supporters 120 can be omitted. The first electrical signal input electrode 150 and the second electrical signal input electrode 152 can be a conductive wire or conductive rod.

In the S3, the electrical signal is inputted to the carbon nanotube film structure 112 through the first electrical signal input electrode 150 and the second electrical signal input electrode 152. When the electric signal is a direct current signal, the first electrical signal input electrode 150 and the second electrical signal input electrode 152 are respectively electrically connected to a positive and a negative of a direct current source. The direct current power inputs the direct current signal to the carbon nanotube film structure 112 through the first electrical signal input electrode 150 and the second electrical signal input electrode 152. When the electrical signal is an alternating current signal, the first electrical signal input electrode 150 is electrically connected to an alternating current source, and the second electrical signal input electrode 152 is connected to earth. The temperature of the carbon nanotube film structure 112 can reach the gasification temperature of the organic light emitting material 114 by inputting an electrical signal power to the evaporating source 110. The electrical signal power can be calculated according to the formula $\sigma T^4 S$. Wherein $\sigma$ represents Stefan-Boltzmann constant; T represents the gasification temperature of the organic light emitting material 114, and S represents the macro area of the carbon nanotube film structure 112. The larger the macro area of the carbon nanotube film structure 112 and the higher the gasification temperature of the organic light emitting material 114, the greater the electrical signal power. Since the carbon nanotube film structure 112 has the small heat capacity per unit area, the carbon nanotube film structure 112 can quickly generate a thermal response to raise the temperature. Since the carbon nanotube film structure 112 has the large specific surface area, the carbon nanotube film structure 112 can quickly exchange heat with surrounding medium, and heat signals generated by the carbon nanotube film structure 112 can quickly heat the organic light emitting material 114. Since the amount of the organic light emitting material 114 disposed on per unit macro area of the carbon nanotube film structure 112 is small, the organic light emitting material 114 can be completely gasified instantly by the heat signals.

Figure 7:
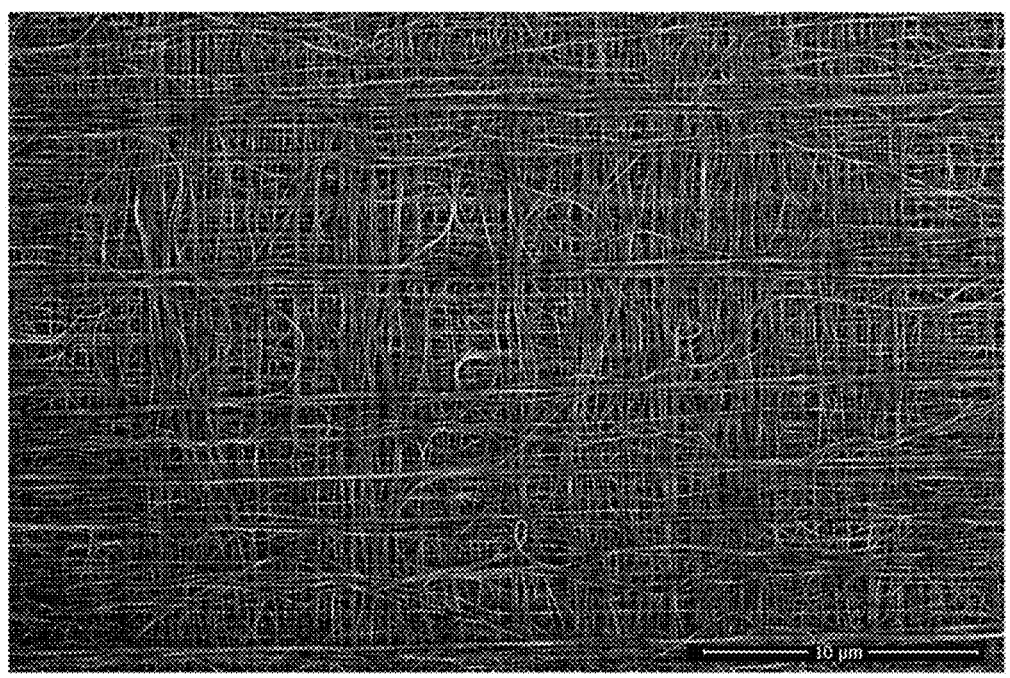
FIG. 7 is a SEM of one embodiment of the evaporating source after evaporation.

FIG. 7 shows a structure of the evaporating source 110 after vacuum evaporation. After evaporating the organic light emitting material 114 located on the surface structure of the carbon nanotube film structure 112, the carbon nanotube film structure 112 retains an original network structure, and the carbon nanotubes of the carbon nanotube film structure 112 are still joined end to end.

Figure 8:
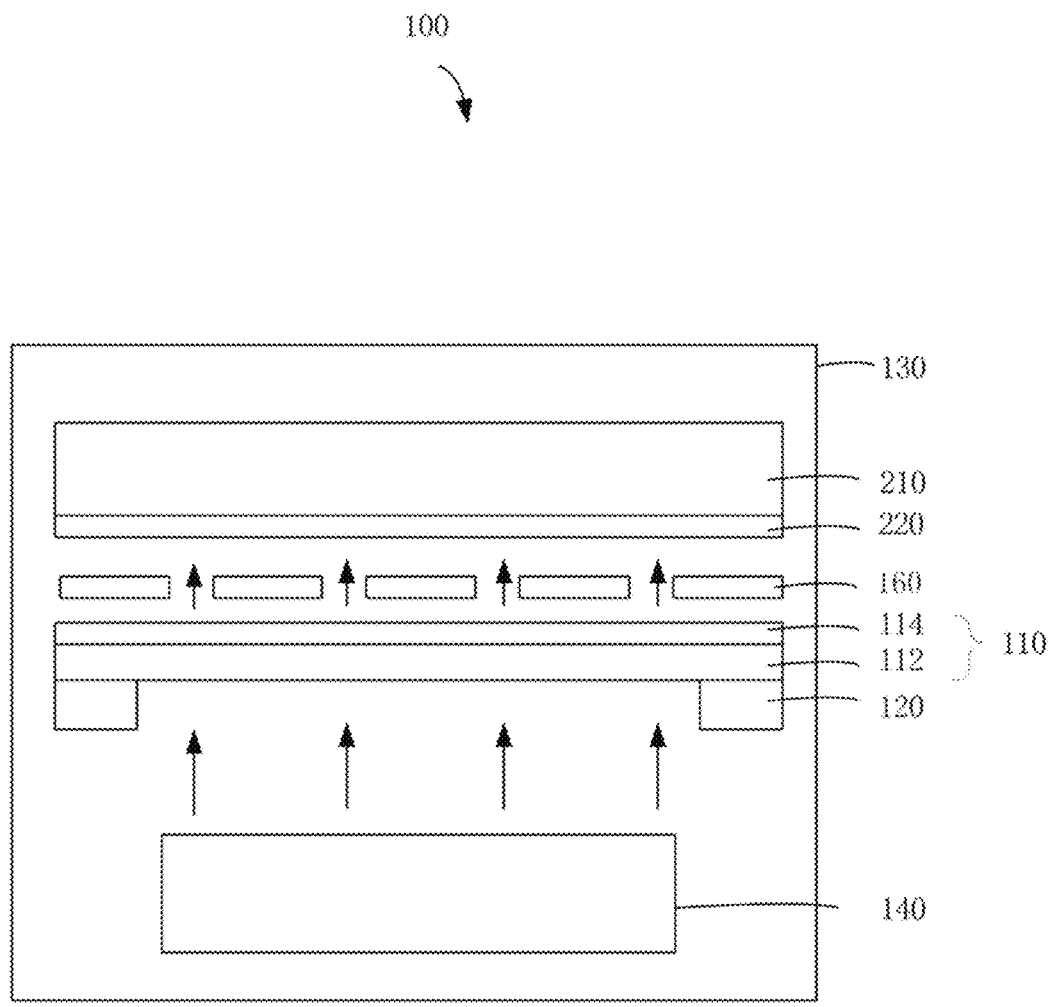
FIG. 8 is a side view of another embodiment of the apparatus for forming the organic thin film solar battery.

Referring FIG. 8, in one embodiment, the S3 further comprises a step of providing a patterned grid 160 and locating the patterned grid 160 between the evaporating source 110 and the surface of the first electrode 220 to form a patterned organic light emitting layer 230.

The patterned grid 160 comprises at least one through hole. The through hole can have a required shape and size. In one embodiment, the patterned grid 160 is respectively in direct contact with the depositing surface and the carbon nanotube film structure 112. In another embodiment, the patterned grid 160 is respectively spaced from the depositing surface and the carbon nanotube film structure 112. The patterned grid 160 is both parallel to the depositing surface and the carbon nanotube film structure 112. The gaseous organic light emitting material 114 is instantly adhered to the depositing surface to form the patterned organic light emitting layer 230 after passing through the through hole. A pattern of the patterned organic light emitting layer 230 is corresponding to the required shape and size of the through hole of the patterned grid 160.

In one embodiment, the patterned grid 160 comprises an array of through holes, thus an array of organic light emitting layers 230 can be formed on the depositing surface to form an OLED display. In another embodiment, in the S2, a plurality of evaporating sources 110 and a plurality of patterned grids 160 are provided to form the patterned organic light emitting layer 230. The plurality of evaporating sources 110 can comprise a plurality of organic light emitting materials 114. The plurality of organic light emitting materials 114 can be formed by different materials with different colors. The plurality of patterned grids 160 can have a different pattern, and each patterned grid 160 corresponds to one evaporating source 110. Thus, the array of organic light emitting layers 230 can be formed having different colors and different patterns.

Figure 9:
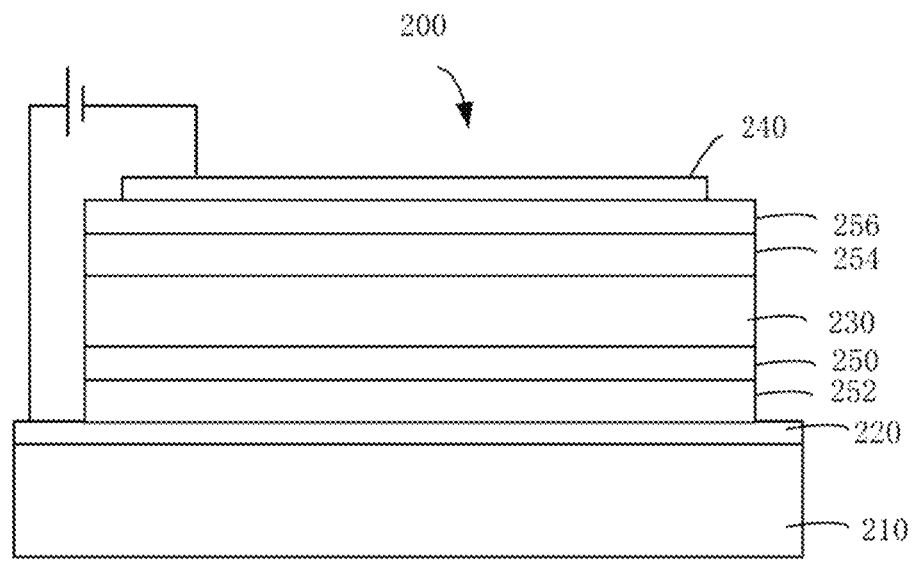
FIG. 9 is a side view of another embodiment of the organic light emitting diode.

Referring FIG. 9, in one embodiment, the organic light emitting diode 200 comprises the substrate 210, the first electrode 220, a hole injection layer 252, a hole transport layer 250, the organic light emitting layer 230, an electron transport layer 254, an electron injection layer 256, and the second electrode 240. The hole injection layer 252, the hole transport layer 250, the electron transport layer 254, and the electron injection layer 256 are selectable structures.

In one embodiment, the method for forming the organic light emitting diode 200 can further comprise a step of forming the hole transport layer 250 on the surface of the first electrode 220 before the step S3. The depositing surface can be a surface of the hole transport layer 250. A method of forming the hole transport layer 250 can be a conventional vapor deposition and mask etching method, a spraying method, an ink jet printing method, or the same as the method of forming the organic light emitting layer 230.

In one embodiment, the method of forming the hole transport layer 250 is the same as the method of forming the organic light emitting layer 230. The method of forming the hole transport layer 250 comprises steps of:

T1: providing a hole transport evaporating source, wherein the hole transport source comprises the carbon nanotube film structure 112 and a hole transport layer material, and the hole transport layer material is located on the surface of the carbon nanotube film structure 112; and T2: spacing the hole transport source from the first electrode 220, and inputting an electromagnetic signal or an electrical signal to heat the carbon nanotube film structure 112 to gasify the hole transport layer material and form the hole transport layer 250 on the surface of the first electrode 220.

In one embodiment, the method for forming the organic light emitting diode 200 can further comprise a step of forming the hole injection layer 252 between the surface of the first electrode 220 and the hole transport layer 250 before the step S3. A method of forming the hole injection layer 252 can be a conventional vapor deposition and mask etching method, a spraying method, an ink jet printing method, or the same as the method of forming the organic light emitting layer 230.

In one embodiment, the method of forming the hole injection layer 252 is the same as the method of forming the organic light emitting layer 230. The method of forming the hole injection layer 252 comprises steps of:

N1: providing a hole injection evaporating source, wherein the hole injection source comprises the carbon nanotube film structure 112 and a hole injection layer material, and the hole injection layer material is located on the surface of the carbon nanotube film structure 112; and N2: spacing the hole injection source from the first electrode 220, and inputting an electromagnetic signal or an electrical signal to heat the carbon nanotube film structure 112 to gasify the hole injection layer material and form the hole injection layer 252 on the surface of the first electrode 220.

In one embodiment, the method for forming the organic light emitting diode 200 can further comprise a step of forming the electron transport layer 254 on the surface of the organic light emitting 230 after the S3 and before the S4. A method of forming the electron transport layer 254 can be a conventional vapor deposition and mask etching method, a spraying method, an ink jet printing method, or the same as the method of forming the organic light emitting layer 230.

In one embodiment, the method of forming the electron transport n layer 254 is the same as the method of forming the organic light emitting layer 230. The method of forming the electron transport layer 254 comprises steps of:

M1: providing an electron transport evaporating source, wherein the electron transport source comprises the carbon nanotube film structure 112 and an electron transport layer material, and the electron transport layer material is located on the surface of the carbon nanotube film structure 112; and M2: spacing the electron transport source from the organic light emitting layer 230, and inputting an electromagnetic signal or an electrical signal to heat the carbon nanotube film structure 112 to gasify the electron transport layer material and form the electron transport layer 254 on the surface of the organic light emitting layer 230.

In one embodiment, the method for forming the organic light emitting diode 200 can further comprise a step of forming the electron injection layer 256 on a surface of the hole the electron transport layer 254 after the S3 and before the S4. A method of forming the electron injection layer 256 can be a conventional vapor deposition and mask etching method, a spraying method, or an ink jet printing method.

A material of the hole transport layer 250 and the hole transport layer material may have a strong hole transporting ability. The material of the hole transport layer 250 and the hole transport layer material can be NPB (N,N'-bis-(1-naphthyl)-N,N'-diphenyl-1,4-diamine), TPD (N,N'-diphenyl-N, N'-bis (m-methylphenyl)-1, Biphenyl-4,4'-diamine), or MTDATA (4,4',4"-tris (3-methylphenylaniline) triphenylamine).

A material of the hole injection layer 252 and the hole injection layer material can be copper phthalocyanine (CuPc) or PEDOT: PSS. The PEDOT is a polymerization of EDOT (3,4-ethylenedioxythiophene monomer). The PSS is polystyrene sulfonate.

A material of the electron transport layer 254 and the electron transport layer material can be an aromatic compound having a large conjugated plane, such as, AlQ (8-Hydroxyquinoline aluminum salt), PBD, Beq2 or DPVBi (4,4'-Bis(2,2-diphenylvinyl)-1,1'-biphenyl).

A material of the electron injecting layer 256 is an alkali metal or an alkali metal compound having a low work function. The material of the electron injecting layer 256 can be lithium fluoride (LiF), calcium (Ca), or magnesium (Mg).

A plurality of organic material layers can be formed on the substrate 210 by changing a material carried on the carbon nanotube film structure 112 and repeating the S3 many times.

One embodiment provides an apparatus 100 for forming the organic light emitting diode 200. The apparatus 100 comprises an evaporating source 110 and a heating device. The evaporating source 110 comprises a carbon nanotube film structure 112 and an organic light emitting material 114. The carbon nanotube film structure 112 is a carrying structure for the organic light emitting material 114. The organic light emitting material 114 is located on a surface of the carbon nanotube film structure 112. The heating device is configured to input an electromagnetic signal or an electrical signal to the carbon nanotube film structure 112 to evaporate the organic light emitting material 114 to form an organic light emitting layer 230. In one embodiment, the heating device can input the electromagnetic signal to the carbon nanotube film structure 112 by an electromagnetic signal input device 140. In another embodiment, the heating device can input the electrical signal to the carbon nanotube film structure 112 by a first electrical signal input electrode 150 and a second electrical signal input electrode 152.

The apparatus 100 can further comprise a vacuum room 130. The evaporating source 110 and a substrate 210 are located in the vacuum room 130. The substrate 210 is spaced from the evaporating source 110.

The apparatus 100 can further comprise two supporters 120. The two supporters 120 are spaced from each other and located on two ends of the carbon nanotube film structure 112. The carbon nanotube film structure 112 is suspended by the two supporters 120.

The apparatus 100 can further comprise at least one patterned grid 160. The at least one patterned grid 160 is located between the evaporating source 110 and a surface of a first electrode 220. The first electrode 220 is located on a surface of the substrate 210.

The apparatus 100 can further comprise a plurality of evaporating sources 110. The plurality of evaporating sources 110 comprises a plurality of organic light emitting materials 114. The plurality of organic light emitting materials 114 can have different colors. Thus, the organic light emitting layer 230 have different colors.

The apparatus 100 can further comprise at least one of a hole injection layer 252, a hole transport layer 250, an electron transport layer 254, and an electron injection layer 256.

The carbon nanotube film is free-standing structure and used to carry an organic light emitting material. The carbon nanotube film has a large specific surface area and good uniformity so that the organic light emitting material carried by the carbon nanotube film can uniformly distribute on the carbon nanotube film before evaporation. The carbon nanotube film can be heated instantaneously. Thus, the organic light emitting material can be completely gasified in a short time to form a uniform gaseous organic light emitting material, and the uniform gaseous organic light emitting material can be uniformly distributed over a large area. The distance between the depositing substrate and the carbon nanotube film is small. Thus, the organic light emitting material carried on the carbon nanotube film can be substantially utilized to save the organic light emitting material and improve the deposition rate.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

Depending on the embodiment, certain of the steps of methods described may be removed, others may be added, and the sequence of steps may be altered. It is also to be understood that the description and the claims drawn to a method may comprise some indication in reference to certain steps. However, the indication used is only to be viewed for identification purposes and not as a suggestion as to an order for the steps.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will, therefore, be appreciated that the embodiments described above may be modified within the scope of the claims.

What is claimed is:

1. A method of forming an organic light emitting diode comprising:
   S1: providing an evaporating source, wherein the evaporating source consists of a carbon nanotube film structure and an organic light emitting material, and the organic light emitting material is located on a carbon nanotube film structure surface;
   S2: providing a substrate and forming a first electrode on a substrate surface;
   S3: spacing the evaporating source from the first electrode, and heating the carbon nanotube film structure to gasify the organic light emitting material and form an organic light emitting layer on a first electrode surface; and
   S4: forming a second electrode on an organic light emitting layer surface;
   wherein the organic light emitting material is deposited on the carbon nanotube film structure surface by a solution method, a vapor deposition method, a plating method or a chemical plating method; and
   wherein the solution method for depositing the organic light emitting material on the carbon nanotube film structure surface comprising:
   S11, dispersing the organic light emitting material in a solvent to form a mixture;
   S12, coating the mixture to the carbon nanotube film structure;
   S13, drying the solvent to make the organic light emitting material uniformly attach on the carbon nanotube film structure surface.

2. The method of claim 1, wherein the organic light emitting material comprises a plurality of materials, and the plurality of materials are dissolved in a liquid phase solvent and mixed with each other.

3. The method of claim 1, further comprising steps of providing a patterned grid and locating the patterned grid between the evaporating source and the first electrode surface to form a patterned organic light emitting layer.

4. The method of claim 1, wherein in the step S3, the evaporating source and the organic light emitting material are located in a vacuum room.

5. The method of claim 1, wherein in step S3, an electromagnetic signal is inputted to heat the carbon nanotube film structure via an electromagnetic signal input device.

6. The method of claim 1, wherein in step S3, an electrical signal is inputted to heat the carbon nanotube film structure by a first electrical signal input electrode and a second electrical signal input electrode.

7. The method of claim 1, further comprising a step of forming a hole transport layer on the first electrode surface before the step S3.

8. The method of claim 1, wherein a distance between the first electrode surface and the carbon nanotube film structure is in a range from about 1 micrometer to about 10 millimeters.

9. The method of claim 1, wherein the evaporating source comprises a plurality of evaporating sources, and the plurality of evaporating sources comprise a plurality of organic light emitting materials with different colors.

10. The method of claim 1, wherein a heat capacity per unit area of the carbon nanotube film structure is less than $2 \times 10^{-4}$ J/cm$^2 \cdot$K, and a specific surface area of the carbon nanotube film structure is larger than 200 m$^2$/g.

11. The method of claim 1, wherein the carbon nanotube film structure comprises at least one carbon nanotube film, and the at least one carbon nanotube film comprises a plurality of nanotubes joined end to end by Van der Waals attractive force.

* * * * *